(12) United States Patent
Li et al.

(10) Patent No.: US 10,748,781 B2
(45) Date of Patent: Aug. 18, 2020

(54) CATALYST-ASSISTED CHEMICAL ETCHING WITH A VAPOR-PHASE ETCHANT

(71) Applicant: The Board of Trustees of the University of Illinois, Urbana, IL (US)

(72) Inventors: Xiuling Li, Champaign, IL (US); Dane J. Sievers, Fisher, IL (US); Lukas Janavicius, Champaign, IL (US); Jeong Dong Kim, Hillsboro, OR (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 16/361,514

(22) Filed: Mar. 22, 2019

(65) Prior Publication Data
US 2019/0221438 A1    Jul. 18, 2019

Related U.S. Application Data

(63) Continuation-in-part of application No. 15/712,498, filed on Sep. 22, 2017, now Pat. No. 10,347,497.
(Continued)

(51) Int. Cl.
*H01L 21/3065*    (2006.01)
*H01L 21/306*     (2006.01)
(Continued)

(52) U.S. Cl.
CPC ........ *H01L 21/3065* (2013.01); *H01L 21/042* (2013.01); *H01L 21/0475* (2013.01);
(Continued)

(58) Field of Classification Search
CPC ............. H01L 21/3065; H01L 21/0475; H01L 21/042; H01L 21/30621; H01L 21/465;
(Continued)

(56) References Cited

U.S. PATENT DOCUMENTS 5,279,705 A * 1/1994 Tanaka .............. H01L 21/31116
                                              438/707
8,951,430 B2   2/2015 Li et al.
(Continued)

OTHER PUBLICATIONS

Hildreth, Owen et al., "Vapor Phase Metal-Assisted Chemical Etching of Silicon," Adv. Funct. Mater., 24 (2014) pp. 3827-3833 (Year: 2014).*

(Continued)

*Primary Examiner* — Duy Vu N Deo
*Assistant Examiner* — Mahmoud Dahimene
(74) *Attorney, Agent, or Firm* — Brinks Gilson & Lione

(57) ABSTRACT

A method of catalyst-assisted chemical etching with a vapor-phase etchant has been developed. In one approach, a semiconductor substrate including a patterned titanium nitride layer thereon is heated, and an oxidant and an acid are evaporated to form a vapor-phase etchant comprising an oxidant vapor and an acid vapor. The semiconductor substrate and the patterned titanium nitride layer are exposed to the vapor-phase etchant during the heating of the semiconductor substrate. The vapor-phase etchant diffuses through the patterned titanium nitride layer, and titanium nitride-covered regions of the semiconductor substrate are etched. Thus, an etched semiconductor structure is formed.

21 Claims, 9 Drawing Sheets

Related U.S. Application Data

(60) Provisional application No. 62/398,722, filed on Sep. 23, 2016.

(51) Int. Cl.

| | | |
|---|---|---|
| *H01L 21/04* | (2006.01) | |
| *H01L 21/465* | (2006.01) | |
| *H01L 29/24* | (2006.01) | |
| *H01L 29/16* | (2006.01) | |
| *H01L 29/20* | (2006.01) | |
| *H01L 29/22* | (2006.01) | |
| *H01L 29/06* | (2006.01) | |

(52) U.S. Cl.
CPC ...... *H01L 21/30621* (2013.01); *H01L 21/465* (2013.01); *H01L 29/0657* (2013.01); *H01L 29/0676* (2013.01); *H01L 29/16* (2013.01); *H01L 29/1602* (2013.01); *H01L 29/1608* (2013.01); *H01L 29/2003* (2013.01); *H01L 29/22* (2013.01); *H01L 29/24* (2013.01)

(58) Field of Classification Search
CPC . H01L 29/0657; H01L 29/0676; H01L 29/16; H01L 29/22; H01L 29/2003; H01L 29/1602; H01L 29/1608; H01L 29/24
See application file for complete search history.

(56) References Cited

U.S. PATENT DOCUMENTS

| | | |
|---|---|---|
| 9,263,662 B2 | 2/2016 | Boukai et al. |
| 9,324,820 B1 | 4/2016 | Kelly et al. |
| 2010/0248449 A1 | 9/2010 | Hildreth et al. |
| 2017/0005207 A1 | 1/2017 | Li et al. |
| 2017/0243751 A1 | 8/2017 | Li et al. |

OTHER PUBLICATIONS

The Hydrofluoric acid material Safety Data Sheet provided by ThermoFisher Scientific in web-page https://www.fishersci.com/msdsproxy%3FproductName%3DA463500%26productDescription%3DHYDROFLUORIC%2BACID%2BOPTIMA%2B500ML%26catNo%3DA463-500%2B%26vendorId%3DVN00033897%26sto (Year: 2010).*

Over Xuewen Geng et al. ("Catalyst and processing effects on metal-assisted chemical etching for the production of highly porous GaN" Semicond. Sci. Technol. 28 (2013)(10 pages)) (Year: 2013).*

Ang, Simon S., "Titanium Nitride Films with High Oxygen Concentration," Journal of Electronic Materials, 17, 2 (1988) pp. 95-100.

Chang, Shih-wei et al., "Metal-Catalyzed Etching of Vertically Aligned Polysilicon and Amorphous Silicon Nanowire Arrays by Etching Direction Confinement," Adv. Funct. Mater., 20 (2010) pp. 4364-4370.

Fukuta, Yamato et al., "Vapor Hydrofluoric Acid Sacrificial Release Technique for Micro Electro Mechanical Systems Using Labware," Jpn. J. Appl. Phys., 42 (2003) pp. 3690-3694.

Hildreth, Owen et al., "Tungsten as a CMOS Compatible Catalyst for the Metal-Assisted Chemical Etching of Silicon to Create 2D and 3D Nanostructures," 2010 Proceedings 60th Electronic Components and Technology Conference (ECTC), Las Vegas, NV, USA (2010) pp. 794-797.

Hildreth, Owen et al., "Vapor Phase Metal-Assisted Chemical Etching of Silicon," Adv. Funct. Mater., 24 (2014) pp. 3827-3833.

Kim, Hyunseok et al., "Local etch control for fabricating nanomechanical devices," Journal of Applied Physics, 108 (2010), pp. 074307-1-074307-3.

Kim, Jungkil et al., "Graphene-Assisted Chemical Etching of Silicon Using Anodic Aluminum Oxides as Patterning Templates," ACS Applied Materials & Interfaces, 7 (2015) pp. 24242-24246.

Kim, Seung Hyun et al., "Inverse Metal-Assisted Chemical Etching Produces Smooth High Aspect Ratio InP Nanostructures," Nano Letters, 15, 1 (2015) pp. 641-648.

Kumar, N. et al., "Transmission electron microscopy studies of brown and golden titanium nitride thin films as diffusion barriers in very large scale integrated circuits," Journal of Vacuum Science & Technology A: Vacuum, Surfaces, and Films, 6 (1988) pp. 1602-1608.

Lai, Chang Quan et al., "Mechanics of Catalyst Motion during Metal Assisted Chemical Etching of Silicon," The Journal of Physical Chemistry C, 117 (2013) pp. 20802-20809.

Lima, L.P.B. et al., "Titanium nitride as electrode for MOS technology and Schottky diode: Alternative extraction method of titanium nitride work function," Microelectronic Engineering, 92 (2012) pp. 86-90.

Liu, Runyu et al., "Enhanced Optical Transmission through MacEtch-Fabricated Buried Metal Gratings," Advanced Materials, 28 (2016) pp. 1441-1448.

Sherman, A., "Growth and Properties of LPCVD Titanium Nitride as a Diffusion Barrier for Silicon Device Technology," J. Electrochem. Soc., 137, 6 (Jun. 1990), pp. 1892-1897.

Suni, I. et al., "Performance of titanium nitride diffusion barriers in aluminum-titanium metallization schemes for integrated circuits," Journal of Vacuum Science & Technology A: Vacuum, Surfaces, and Films, 3 (1985) pp. 2233-2236.

Ting, C. Y., "TiN formed by evaporation as a diffusion barrier between Al and Si," Journal of Vacuum Science & Technology, 21, 1 (1982) pp. 14-18.

* cited by examiner

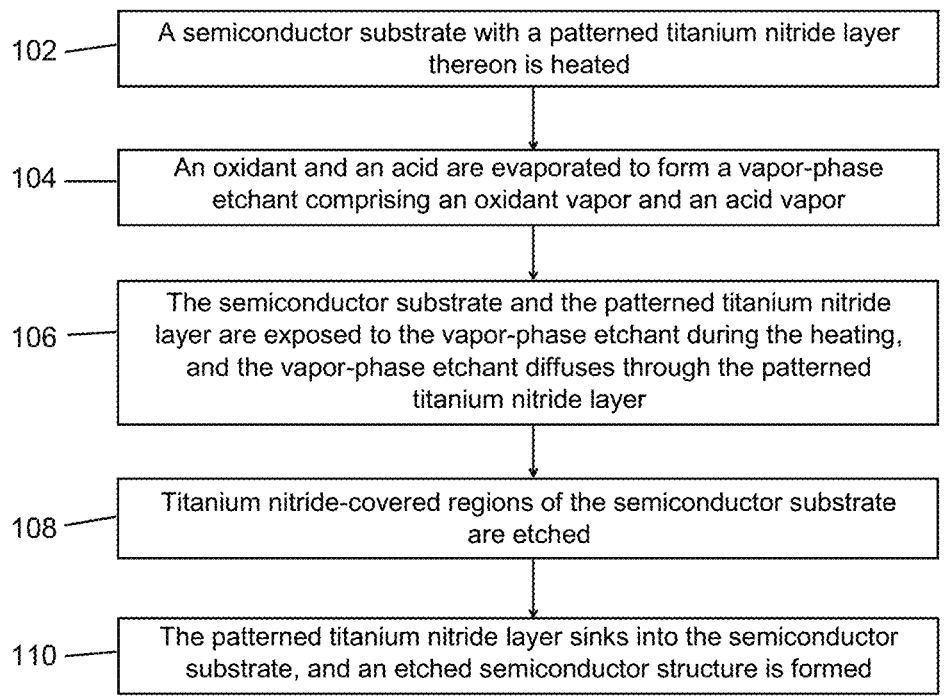
FIG. 1
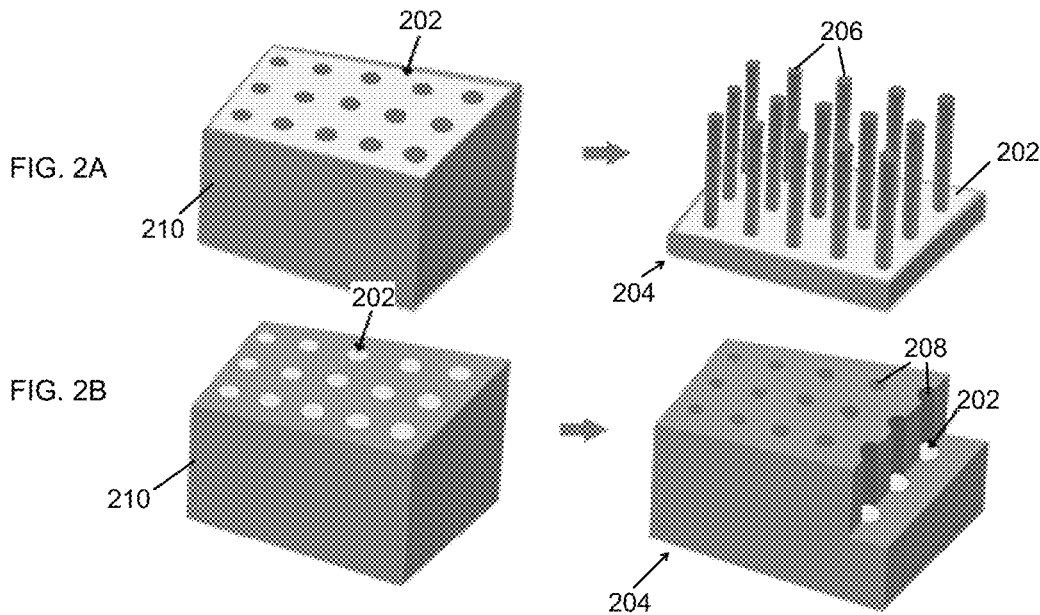
FIG. 2A
FIG. 2B

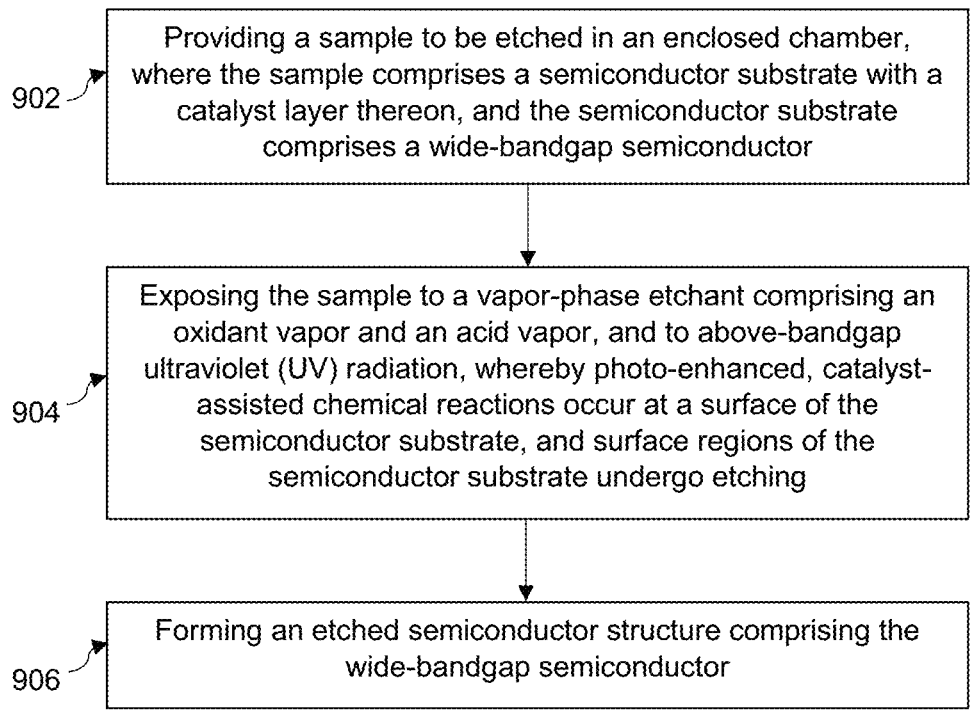
FIG. 9A
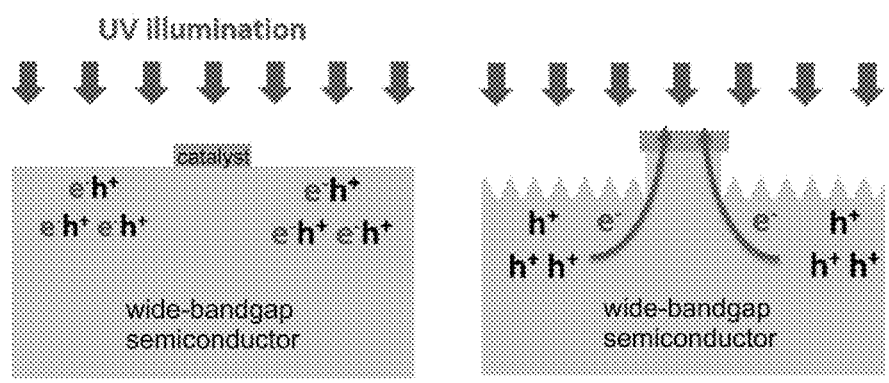
FIG. 9B                    FIG. 9C

CATALYST-ASSISTED CHEMICAL ETCHING WITH A VAPOR-PHASE ETCHANT

RELATED APPLICATIONS

The present patent document is a continuation-in-part of U.S. patent application Ser. No. 15/712,498, which was filed on Sep. 22, 2017, and which claims the benefit of priority under 35 U.S.C. § 119(e) to U.S. Provisional Patent Application Ser. No. 62/398,722, which was filed on Sep. 23, 2016. All of the aforementioned patent applications are hereby incorporated by reference in their entirety.

TECHNICAL FIELD

The present disclosure is related generally to chemical etching of semiconductors and more particularly to metal-assisted chemical etching (MacEtch).

BACKGROUND

Metal-assisted chemical etching (MacEtch or MaCE) is a local electrochemical etching method capable of producing anisotropic, high-aspect ratio semiconductor structures with a simple wet etching process. MacEtch can avoid ion-induced damage and sidewall scallops characteristic of conventional deep reactive ion etching. Nanowires, vias and trenches with electronic and optoelectronic device applications have been demonstrated using MacEtch on silicon and compound semiconductor substrates.

A typical silicon MacEtch process starts by depositing a metal catalyst onto a silicon substrate. The metal catalyst can be patterned into any arbitrary two-dimensional shape. Then, the silicon substrate is immersed in a solution mixture of a suitable acid and oxidant to selectively oxidize and dissolve portions of the silicon substrate localized under the metal catalyst. During MacEtch, at the liquid-catalyst interface, electronic holes are produced by the reduction reaction of the oxidant (cathodic reaction) and injected in the valence band to produce oxidized silicon (anodic reaction), which is selectively dissolved by the acid.

Noble metals such as gold (Au) have been reported to be effective MacEtch catalysts. However, despite various advantages and simplicity, gold catalysts may be associated with deep level defects in silicon; thus, there are limitations in applying MacEtch to electronic device applications, specifically front end of the line (FEOL) and back end of the line (BEOL) processes in complementary metal-oxide-semiconductor (CMOS) fabrication. In addition, the MacEtch process can be associated with "inverse" etching, where regions of the semiconductor substrate that are not localized under the metal catalyst undergo unintended etching.

BRIEF SUMMARY

A method of catalyst-assisted chemical etching with a vapor-phase etchant has been developed.

According to one embodiment of the method, a semiconductor substrate including a patterned titanium nitride layer thereon is heated, and an oxidant and an acid are evaporated to form a vapor-phase etchant comprising an oxidant vapor and an acid vapor. The semiconductor substrate and the patterned titanium nitride layer are exposed to the vapor-phase etchant during the heating of the semiconductor substrate. The vapor-phase etchant diffuses through the patterned titanium nitride layer, and titanium nitride-covered regions of the semiconductor substrate are etched. Thus, an etched semiconductor structure is formed.

According to another embodiment, the method comprises heating a semiconductor substrate having a patterned catalyst layer thereon, and depositing one or more droplets comprising a mixture of an oxidant and an acid onto or adjacent to the semiconductor substrate in a vicinity of the patterned catalyst layer. The one or more droplets increase in temperature and evaporate to form a vapor-phase etchant comprising an oxidant vapor and an acid vapor. The vapor-phase etchant diffuses through the patterned catalyst layer and catalyst-covered regions of the semiconductor substrate are etched, thereby forming an etched semiconductor structure.

According to another embodiment, the method comprises heating a sample to be etched in an enclosed chamber, where the sample comprises a semiconductor substrate with a patterned catalyst layer thereon. An oxidant source which is in fluid communication with the enclosed chamber and which comprises an oxidant is heated to form an oxidant vapor, and an acid source which is in fluid communication with the enclosed chamber and which comprises an acid is heated to form an acid vapor. During the heating of the sample, the sample is exposed to a vapor-phase etchant comprising the oxidant vapor and the acid vapor. The vapor-phase etchant diffuses through the patterned catalyst layer and etches catalyst-covered regions of the semiconductor substrate. Thus, an etched semiconductor structure is formed.

According to another embodiment, the method comprises providing a sample to be etched in an enclosed chamber, where the sample comprises a semiconductor substrate with a patterned catalyst layer thereon, and the semiconductor substrate comprises a wide-bandgap semiconductor. The sample is exposed to a vapor-phase etchant comprising an oxidant vapor and an acid vapor. Simultaneously, the sample is exposed to ultraviolet (UV) radiation. Photo-enhanced, catalyst-assisted chemical reactions occur at a surface of the semiconductor substrate, and surface regions of the semiconductor substrate undergo etching. Thus, an etched semiconductor structure comprising the wide-bandgap semiconductor is formed.

A modular apparatus for catalyst-assisted chemical etching with a vapor-phase etchant comprises: (a) an inner chamber comprising a gas injection system for delivery of an etchant vapor to a sample to be etched in the inner chamber; (b) an outer chamber for containing reactants that includes an oxidant bubbler and an acid bubbler configured for transport of an acid vapor and an oxidant vapor to the gas injection system; and (c) a UV-transparent window in the outer chamber positioned to allow ultraviolet light exposure of the sample during etching.

A method of titanium nitride-assisted chemical etching with a liquid-phase etchant comprises providing a patterned TiN layer on a semiconductor substrate, and immersing the patterned TiN layer and the semiconductor substrate into an etchant solution comprising an acid and an oxidizing agent. During the immersion in the etchant solution, at least a portion of the semiconductor substrate immediately below the patterned TiN layer is selectively removed, thereby forming an etched semiconductor structure.

BRIEF DESCRIPTION OF THE DRAWINGS

FIG. 1 is a flow chart of an exemplary method of vapor-phase, catalyst-assisted chemical etching, which may be referred to as vapor-phase MacEtch.

FIG. 2A is a schematic showing a semiconductor substrate covered by a patterned catalyst layer having a continuous mesh pattern before (left) and after (right) vapor-phase MacEtch.

FIG. 2B is a schematic showing a semiconductor substrate covered by a patterned catalyst layer having a discontinuous pattern before (left) and after (right) vapor-phase MacEtch.

FIG. 9A is a flow chart of an exemplary photo-assisted vapor-phase MacEtch process.

FIGS. 9B and 9C illustrate the mechanism of photo-assisted vapor-phase MacEtch.

DETAILED DESCRIPTION

Figure 3:
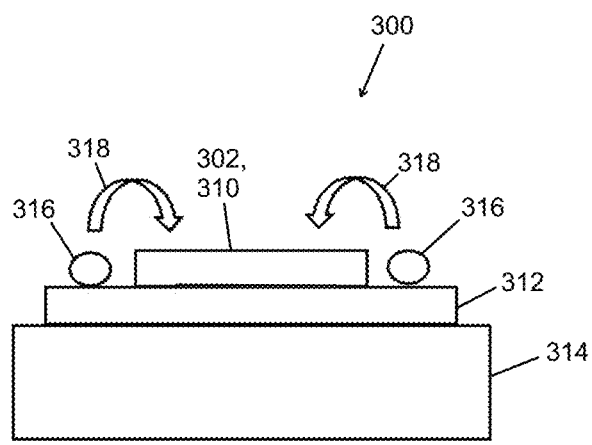
FIG. 3 shows an exemplary apparatus for vapor-phase MacEtch.

A new approach to metal-assisted chemical etching ("MacEtch") that utilizes a vapor-phase etchant to chemically carve out high-aspect ratio features in semiconductors has been developed. The new chemical etching technique, which may be referred to as vapor-phase MacEtch, can avoid ion-induced damage common to reactive ion etching methods as well as the undesirable inverse etching that can occur with conventional liquid-phase MacEtch. Using a novel, CMOS-compatible titanium nitride catalyst, vapor-phase MacEtch can produce high-aspect ratio features in silicon without introducing deep-level defects, a common problem when metal catalysts such as gold are employed. The new chemical etching method may be employed with the CMOS-compatible titanium nitride catalyst or with conventional metal catalysts to etch a broad range of semiconductors. Since a metal catalyst is not required, vapor-phase MacEtch may be described as vapor-phase, catalyst-assisted chemical etching.

Described in reference to FIGS. 1 and 2 is a vapor-phase MacEtch process utilizing the new CMOS-compatible titanium nitride catalyst. Then, two different approaches to implementing vapor-phase MacEtch with the titanium nitride catalyst or another suitable catalyst (e.g., a metal catalyst) are described in reference to FIGS. 3 and 4. The applicability of vapor-phase, catalyst-assisted chemical etching to wide-bandgap semiconductors is described in reference to FIG. 9, and a modular apparatus designed for vapor-phase MacEtch—in particular, photo-assisted vapor-phase MacEtch of wide-bandgap semiconductors—is described in reference to FIG. 10. Also described below is the use of the new electrically conductive titanium nitride catalyst with conventional liquid-phase MacEtch.

Referring first to the flow chart of FIG. 1, a vapor-phase chemical etching process utilizing the titanium nitride catalyst is described. The method entails heating 102 a semiconductor substrate that includes a patterned titanium nitride layer thereon. Given the CMOS-compatibility of titanium nitride, the semiconductor substrate may comprise silicon (but is not limited to silicon). An oxidant and an acid, such as hydrogen peroxide ($H_2O_2$) and hydrofluoric acid (HF), respectively, are evaporated 104 to form a vapor-phase etchant comprising an oxidant vapor (e.g., $H_2O_2$ vapor) and an acid vapor (e.g., HF vapor).

The semiconductor substrate and the patterned titanium nitride layer thereon are exposed 106 to the vapor-phase etchant as the semiconductor substrate is heated, and the vapor-phase etchant diffuses through the patterned titanium nitride layer. Though a nonmetal, titanium nitride can act as a catalyst for etching, which is unexpected. The suitability of titanium nitride may be due to its high work function (about 4.2-4.5 eV) and electrochemical potential (about 0.5-0.9 V), in combination with resistance to HF. The oxidant vapor selectively oxidizes regions of the semiconductor substrate underneath the patterned titanium nitride layer (i.e., titanium nitride-covered regions), and the acid vapor selectively removes the oxidized regions. Accordingly, titanium nitride-covered regions of the semiconductor substrate are etched 108, inducing the patterned titanium nitride layer to sink into the semiconductor substrate. Thus, an etched semiconductor structure is formed 110.

Referring to FIG. 2A, the patterned titanium nitride layer 202 on the semiconductor substrate 210 may take the form of a continuous mesh pattern (left schematic). Once forward etching is successfully carried out, as described in the flow chart of FIG. 1, the etched semiconductor structure 204 may comprise an array of nanowires 206 (right schematic). Alternatively, the patterned titanium nitride layer 202 may take the form of a discontinuous pattern comprising a plurality of discrete features, as shown for example in FIG. 2B (left schematic). In this case, following forward etching, the etched semiconductor structure 204 may comprise an array of channels 208 (right schematic).

Uncovered regions of the semiconductor substrate 210 may be substantially unetched; in other words, inverse etching may be minimized or avoided altogether with the vapor-phase MacEtch process described here. In contrast, using conventional liquid-phase MacEtch with a titanium nitride catalyst, inverse etching of the semiconductor substrate is difficult to avoid, as discussed in the Examples below. To facilitate forward etching, the semiconductor substrate 210 may be heated to a temperature in a range from about 30° C. to about 95° C., or from about 50° C. to about 95° C. Experiments show that an increased etching temperature may enhance mass transfer during etching, thereby promoting forward etching and enabling the fabrication of higher aspect ratio etched features. The vapor-phase etchant may be at the same or approximately the same temperature as the semiconductor substrate 210 to minimize or eliminate condensation of the etchant on the sample surface, which could block the diffusion path of the vapor-phase etchant and byproduct vapor species through the patterned titanium nitride layer. Also or alternatively, the process may be carried out in a controlled environment comprising an inert atmosphere or a vacuum.

As shown in FIG. 3 and described in detail below, evaporating the oxidant and the acid to form the vapor-phase etchant may entail depositing one or more droplets comprising a mixture of the oxidant and the acid onto or adjacent to the semiconductor substrate. The one or more droplets are deposited in a vicinity of the patterned titanium nitride layer prior to or during the heating of the semiconductor substrate.

Figure 4:
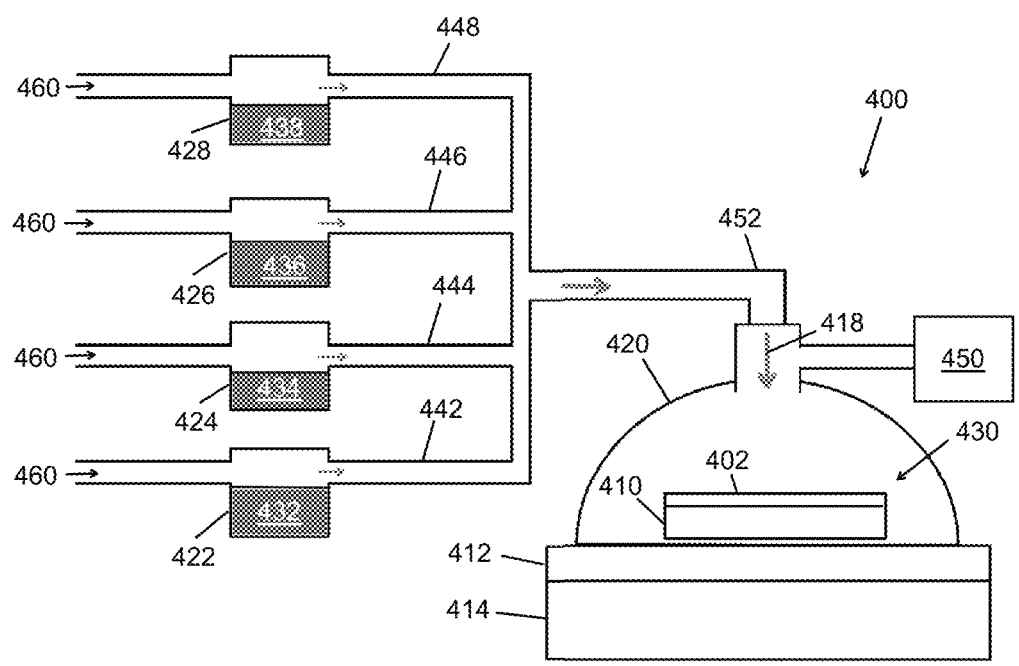
FIG. 4 shows an exemplary apparatus for vapor-phase MacEtch.

As shown in FIG. 4 and described in detail below, evaporating the oxidant and the acid to form the vapor-phase etchant may comprise separately heating an oxidant source containing the oxidant to form the oxidant vapor and separately heating an acid source containing the acid to form the acid vapor. In such an example, the semiconductor substrate may be disposed in an enclosed chamber which is connected to each of the oxidant source and the acid source by a flow channel, and evaporation of the oxidant and the acid may occur at locations remote from the sample to be etched.

Returning to the example of FIG. 3, evaporation of the oxidant and the acid may occur in a vicinity of the patterned catalyst layer, that is, within a few centimeters of the patterned catalyst layer. FIG. 3 shows a sample 300 including a patterned catalyst layer 302 on a semiconductor substrate 310 supported by a sample support 312, which in turn is supported on a hot plate 314 or other heat source. The patterned catalyst layer 302 may be a patterned titanium nitride (TiN) layer or another patterned metal catalyst, as set forth below, and the semiconductor substrate 310 may comprise silicon or another substrate, also as set forth below. Additionally, the patterned catalyst layer 302 may have any desired two-dimensional pattern, such as one of the continuous or discontinuous patterns illustrated in FIGS. 2A and 2B.

Prior to or during heating of the semiconductor substrate 310, one or more droplets 316 comprising a mixture of the oxidant and the acid are deposited on or adjacent to the semiconductor substrate 310 in a vicinity of the patterned catalyst layer 302. In this example, the droplet(s) 316 are deposited on the sample support 312 that underlies and extends beyond the semiconductor substrate 304. Typically, each droplet 316 has a volume in a range from about 1 µL to about 100 µL, such as from 2 µL to 20 µL. The droplet(s) 316 increase in temperature and evaporate, and the semiconductor substrate 310 and the patterned catalyst layer 302 are exposed to a vapor-phase etchant 318 comprising an oxidant vapor and an acid vapor. As described above, the vapor-phase etchant 318 diffuses through the patterned catalyst layer 302, and the oxidant vapor selectively oxidizes catalyst-covered regions of the semiconductor substrate 310 while the acid vapor removes the catalyst-covered regions post-oxidation. Once each droplet 316 evaporates, another droplet comprising a mixture of the oxidant and the acid may be deposited and evaporated as described above, and so on until the vapor-phase etching process is complete. Thus, catalyst-covered regions of the semiconductor substrate are etched, causing the patterned catalyst layer 302 to sink into the semiconductor substrate 310 as shown in FIGS. 2A and 2B, and an etched semiconductor structure is formed.

Uncovered regions of the semiconductor substrate 310 may be substantially unetched; in other words, inverse etching may be minimized or avoided altogether with the vapor-phase MacEtch process described in reference to FIG. 3. To facilitate forward etching, the semiconductor substrate 310 may be heated to a temperature in a range from about 30° C. to about 95° C., or from about 50° C. to about 95° C. The vapor-phase etchant 318 may be at the same or approximately the same temperature as the semiconductor substrate 310 to minimize or eliminate condensation of the etchant 318 on the sample surface, which could block the diffusion path of the vapor-phase etchant and byproduct vapor species through the patterned catalyst layer 302. The process may be carried out in a controlled environment comprising an inert atmosphere or a vacuum.

In the approach of FIG. 4, the evaporation of the oxidant and the acid to form the vapor-phase etchant occurs away from the semiconductor substrate, and the oxidant and acid are provided separately prior to vaporization, instead of as a mixture. Independent vaporization can permit precise control of the oxidant-to-acid ratio since different temperatures may be used to heat and evaporate each species. Once produced, the semiconductor substrate is exposed to the vapor-phase etchant.

The method may be carried out in the reactor 400 shown in FIG. 4, which includes an enclosed chamber 420 configured to hold a sample 430 in a controlled environment (e.g., an inert gas atmosphere or a vacuum). An oxidant source 422 containing an oxidant 432 is connected to the enclosed chamber 420 by a first flow channel 442, and an acid source 424 containing an acid 434 is connected to the enclosed chamber 410 by a second flow channel 444. The sample includes a semiconductor substrate 410 with a patterned catalyst layer 402 thereon. The patterned catalyst layer 402 may be a patterned TiN catalyst layer or a patterned metal catalyst layer having any desired two-dimensional pattern, and the semiconductor substrate 410 may comprise silicon or another substrate.

Additional vapor sources, including a water vapor source 426 and/or an alcohol (e.g., isopropyl alcohol) source 428, may be provided and, in this example, connected to the enclosed chamber 420 by additional flow channels 446,448. The enclosed chamber 420 may also be connected to one or more pumps 450 to provide the desired controlled environment, such as a vacuum or a low-pressure inert gas atmosphere.

To carry out the method, the oxidant source 422 containing the oxidant 432 is heated to form an oxidant vapor, and the oxidant vapor is transported through the first flow channel 442 to the enclosed chamber 420. Typically simultaneously, the acid source 424 containing the acid 434 is heated to form an acid vapor, and the acid vapor is transported through the second flow channel 444 to the enclosed chamber 420. Since the oxidant 432 and the acid 434 are heated separately, the oxidant 432 can be heated to a temperature selected to produce a particular vapor pressure of the oxidant 432, while the acid 434 is heated to a temperature selected to produce a particular vapor pressure of the acid 434. Any additional vapor sources (e.g., the water vapor and/or alcohol sources) 426,428 may also be heated to a suitable temperature to produce a desired vapor pressure of each species 436,438. The water and/or alcohol vapor may function in part as a carrier gas during transport of the oxidant and acid vapors to the sample 430. Together, the oxidant vapor and the acid vapor form a vapor-phase etchant 418 which is exposed to the sample in the enclosed chamber.

The sample 430 to be etched in the enclosed chamber 420 may optionally be heated. In such a case, the sample may be heated to a temperature as high as, or higher than, the oxidant and acid vapors. A resistive heating element or hot plate 414 underlying the semiconductor substrate 410 may act as a heat source for the sample, as illustrated in FIG. 4. In this example, the sample 430 to be etched is placed on a sample support (e.g., silicon carbide substrate) 412 that is in contact with the heat source 414. The sample 430 may alternatively be heated by a remote heat source, such as a laser, which is located outside the enclosed chamber 420.

As the sample 430 is heated, the vapor-phase etchant 418 diffuses through the patterned catalyst layer 402 and etches catalyst-covered regions of the semiconductor substrate 410, thereby forming an etched semiconductor structure. Once etching is concluded, water vapor (only) may be supplied to the enclosed chamber 420 to rinse the etched semiconductor structure and an interior of the chamber 420.

Each vapor may be transported from the vapor source to the chamber using a carrier gas. Referring again to FIG. 4, a carrier gas 460 may be flowed through the oxidant source 422 at a predetermined pressure or flow rate to transport the oxidant vapor through the first flow channel 442. The oxidant vapor becomes entrained in the carrier gas 460 and is delivered from the oxidant source 422 to the enclosed chamber 420. Similarly, a carrier gas 460 is flowed through the acid source 424 at a predetermined pressure or flow rate, entraining the acid vapor and delivering it from the acid source 424 to the enclosed chamber 420. The carrier gas 460 used to transport the oxidant vapor and the acid vapor may be an inert carrier gas such as nitrogen, argon or helium. Typically, the same carrier gas 460 is used for transporting the oxidant, acid, and/or other vapors, although different carrier gases may be used if desired. A mass flow controller can be used to monitor and control the flow of the carrier gas through each vapor source, which may take the form of a gas bubbler.

As shown in FIG. 4, the first flow channel and the second flow channel 442,444 (as well as any additional flow channels 446,448) may converge to a single flow inlet 452 prior to entering the enclosed chamber 420. In this case, the vapor-phase etchant 418 is formed from the oxidant vapor and the acid vapor in the single flow inlet 452 prior to reaching the enclosed chamber 420. Alternatively, the first flow channel and the second flow channel may enter the enclosed chamber through separate flow inlets, and the vapor-phase etchant may be formed from the oxidant vapor and the acid vapor in the enclosed chamber.

In other embodiments of the method, the vapor sources (oxidant, acid, water, and/or alcohol sources) may be configured for separate heating but positioned within the same enclosed chamber as the sample to be etched. Whether positioned remote from the sample, as shown in FIG. 4, or adjacent to the sample (e.g., within the enclosed chamber, as possible in an alternative embodiment), the separately heated vapor source(s) may be said to be in fluid communication with the enclosed chamber. For one component to be "in fluid communication with" another component means that fluid (or more particularly vapor) from the one component can reach the other component.

Uncovered regions of the semiconductor substrate 410 may be substantially unetched; in other words, inverse etching may be minimized or avoided altogether with the vapor-phase MacEtch process described in reference to FIG. 4. To facilitate forward etching, the semiconductor substrate 410 may be heated to a temperature in a range from about 30° C. to about 95° C., or from about 50° C. to about 95° C. The vapor-phase etchant 418 may be at the same or approximately the same temperature as the semiconductor substrate 410 to minimize or eliminate condensation of the etchant 418 on the sample surface, which could block the diffusion path of the vapor-phase etchant 418 and byproduct vapor species through the patterned catalyst layer 402.

Another approach to vapor-phase, catalyst-assisted chemical etching is set forth in the flow chart of FIG. 9A. In this approach, ultraviolet (UV) radiation may serve as an external excitation source for electron and hole generation, and thus the vapor-phase etching process may be described as being UV photo-assisted. This approach may be particularly beneficial for etching wide-bandgap semiconductors, because UV light, especially vacuum UV wavelengths less than about 180 nm, do not penetrate in liquids.

Referring to FIG. 9A, a sample to be etched comprising a semiconductor substrate with a patterned catalyst layer thereon is provided 902 and optionally heated in an enclosed chamber. The semiconductor substrate comprises a wide-bandgap semiconductor, and the patterned catalyst layer is a patterned metal or TiN catalyst layer. The sample is exposed 904 to an oxidant vapor and an acid vapor, which together form a vapor-phase etchant. Simultaneously, the sample is exposed to above-gap UV radiation, which has a photon energy higher than the bandgap of the wide-bandgap semiconductor. Photo-enhanced, catalyst-assisted chemical reactions occur at a surface of the semiconductor substrate, and surface regions of the semiconductor substrate are etched. More specifically, the oxidant dissociates at the surface of the patterned catalyst layer. Because of the low mobility of charge carriers in wide bandgap semiconductors, photo-generated carriers may be necessary to enable etching. Electrons and holes are generated in the surface regions that absorb the UV radiation. When electrons get consumed by oxidation/reduction, photo-generated electrons diffuse towards the catalyst layer and excess holes occur in surface regions away from the catalyst layer to induce etching. Thus, an etched semiconductor structure comprising a wide-bandgap semiconductor may be formed 906 in a photo-assisted, vapor-phase chemical etching process. The mechanism for this process is discussed below for an exemplary wide-bandgap semiconductor with respect to FIGS. 9B and 9C.

The patterned catalyst layer may have any desired two-dimensional pattern. The etching may be inverse etching, where surface regions of the semiconductor substrate that are not covered by the patterned catalyst layer (i.e., that are disposed away from the patterned catalyst layer) are etched, and surface regions covered by the patterned catalyst layer are substantially unetched. This is typically the case with patterned catalyst layers comprising metals that absorb UV light. The mechanism for inverse etching is discussed below for an exemplary wide-bandgap semiconductor. The etching may alternatively be forward etching, particularly if the UV light can pass through or go around the patterned catalyst layer. For example, forward etching may occur for a UV-transparent patterned catalyst layer comprising graphene or a transparent metal. In this case, surface regions of the semiconductor substrate covered by the patterned catalyst layer may undergo etching. The height or depth of features formed in the etched semiconductor structure may be determined by the duration of photo-assisted vapor-phase MacEtch, along with the etch rate.

To expose the sample to the vapor-phase etchant, an oxidant contained in an oxidant source external to the inner chamber is vaporized and delivered to the enclosed chamber, and an acid contained in an acid source external to the enclosed chamber is vaporized and delivered to the inner chamber. As in the approach described above in reference to FIG. 4, the oxidant and acid sources in this example are separate from each other and remote from the sample to be etched; thus, evaporation of each of the oxidant and the acid may occur independently, away from the semiconductor substrate to be etched. Independent vaporization can permit precise control of the oxidant-to-acid ratio.

Heating the sample is not required but may be beneficial for improving the rate of the reaction, and thus the etch rate. A sample holder or chuck configured to hold the sample may function as a heater for the sample. For example, the sample holder may include a resistive heating element or may be in contact with a heat source. The sample, and thus the semiconductor substrate, may be heated to a temperature in a range from about 30° C. to about 95° C., or from about 50° C. to about 95° C. to facilitate etching. Ideally, the temperature of the semiconductor substrate is at least as high as or higher than that of the oxidant and acid vapors to minimize or eliminate condensation of the vapor-phase etchant on the sample surface. Condensation can block the diffusion path of the vapor-phase etchant and byproduct vapor species through the patterned catalyst layer, thereby reducing the etch rate.

Experiments reveal that etch rates in a range from about 10 nm/min to about 10 μm/min are achievable during UV photo-assisted vapor-phase MacEtch of wide-bandgap semiconductors. Once etching is concluded, water vapor (only) may be supplied to the enclosed chamber to rinse the etched semiconductor structure and an interior of the chamber.

The UV radiation to which the sample is exposed to enhance etching may be generated by a UV source, such as a mercury lamp, positioned outside the enclosed chamber. The UV radiation may reach the sample via a UV-transparent window, which may also be transparent to visible wavelengths to enable external viewing of the process. In one example, the UV-transparent window may comprise sapphire. Depending on the UV source and the wavelength transparency of the UV-transparent window, the UV radiation to which the sample is exposed may have a wavelength in a range from about 100 nm to about 300 nm, and/or from about 10 nm to about 180 nm; in the latter case, the UV radiation may be referred to as vacuum UV radiation.

The enclosed chamber may provide a controlled environment for the vapor-phase etching process. The controlled environment may comprise a nitrogen ($N_2$) atmosphere or vacuum, both of which may be penetrated by UV radiation. In contrast, air contains oxygen molecules that absorb UV radiation, and liquids also absorb UV radiation. A modular apparatus designed to provide a controlled environment for photo-assisted vapor-phase MacEtch is described below in reference to FIG. 10.

For the vapor-phase MacEtch processes described above in reference to FIGS. 1-4 and 9A, the oxidant and oxidant vapor may comprise hydrogen peroxide ($H_2O_2$), $KMnO_4$, $K_2S_2O_8$, and/or $Na_2S_2O_8$, and the acid and acid vapor may comprise hydrofluoric acid (HF), $NH_4F$ and/or nitric acid ($HNO_3$), depending on the catalyst employed for etching and the semiconductor being etched. The term "acid" may be used in reference to an acid (e.g., HF) or other species (e.g., $NH_4F$) capable of dissolving and/or removing the oxidized semiconductor. Generally speaking, the vapor pressure (or partial vapor pressure) of the oxidant and the vapor pressure (or partial vapor pressure) of the acid are selected to achieve the desired molar ratio. The patterned catalyst layer may comprise Pt, Au, Ir, TiN, Cu, graphene, and/or carbon nanotubes.

In an example where the semiconductor comprises silicon, the patterned catalyst layer comprises titanium nitride, the oxidant is hydrogen peroxide, and the acid is hydrofluoric acid. The partial vapor pressure of the oxidant may be from about 1 Torr to about 10 Torr, the partial vapor pressure of the acid may be from about 20 Torr to about 60 Torr, and the vapor-phase etchant may have a molar ratio of oxidant vapor to acid vapor in a range from about 0.02 to about 10.

In another example where the semiconductor comprises a wide-bandgap semiconductor, such as silicon carbide (which undergoes photo-assisted vapor-phase MacEtch in the experimental example below), the patterned catalyst layer may comprise platinum, the oxidant may be hydrogen peroxide, and the acid may be hydrofluoric acid. The partial vapor pressure of the oxidant may be from about 1 Torr to about 10 Torr, the partial vapor pressure of the acid may be from about 20 Torr to about 60 Torr, and the vapor-phase etchant may have a molar ratio of oxidant vapor to acid vapor in a range from about 0.02 to about 10.

The length of time the semiconductor substrate and the patterned catalyst layer are exposed to the vapor-phase etchant during heating may determine the etching duration. Typically, etching is carried out for a duration of about several seconds to tens of minutes. The length of the etched features (e.g., channels, nanowires, nanopillars, or other high-aspect ratio morphology) formed in the etched semiconductor structure depends on the etching duration. For example, the etching duration may be from about 10 seconds to about 60 minutes. Typically, the time duration is from about 1 minute to about 30 minutes, or from about 5 minutes to about 20 minutes. High aspect ratio etched features of up to hundreds of nanometers or even tens of microns in length can be obtained.

As indicated above, the semiconductor substrate and the etched semiconductor structure may comprise any of a number of semiconductors, including silicon, germanium, III-V semiconductors, and/or wide-bandgap semiconductors, such as Group III nitrides, Group II oxides and/or Group II chalcogenides. A wide-bandgap semiconductor may be understood to be a semiconductor having a bandgap greater than 1.5 eV, and typically in a range from about 2 eV to about 6 eV. Particular examples of wide-bandgap semiconductors that may undergo photo-assisted vapor-phase MacEtch include gallium nitride (GaN), zinc oxide (ZnO), zinc selenide (ZnSe), silicon carbide (SiC), $LiNO_4$, diamond, and gallium oxide ($Ga_2O_3$). The patterned catalyst layer may comprise TiN, as discussed above, or a metal such as Ag, Au, Cu, Pd or Pt. Typically, the patterned catalyst layer has a thickness in a range from about 10 nm to about 50 nm. Given that TiN has a significantly higher stiffness than more conventionally used metal catalysts, thinner TiN layers (e.g., less than 10 nm in thickness) may provide better adhesion with the semiconductor substrate, which may promote forward etching. For example, when TiN is employed as the catalyst, the patterned TiN layer may have a thickness in a range from about 2 nm to about 10 nm.

The etch rate for vapor-phase MacEtch may in some cases be much higher than that achievable by liquid-phase MacEtch. For example, using TiN as a catalyst with silicon, the etch rate may be increased by about 6 to 10 times or more, compared to conventional liquid-phase MacEtch. This is because of the enhancement of the mass transport rate in the gas phase. However, for cases where etching is not limited by mass transport, such as Au-catalyzed MacEtch of silicon using a relatively high HF concentration, the etch rate using vapor-phase MacEtch may be slower than that obtained with liquid-phase MacEtch. In the case of UV photo-assisted vapor-phase MacEtch of wide-bandgap semiconductors, high etch rates of 5-10 μm/min may be achievable.

Figure 10:
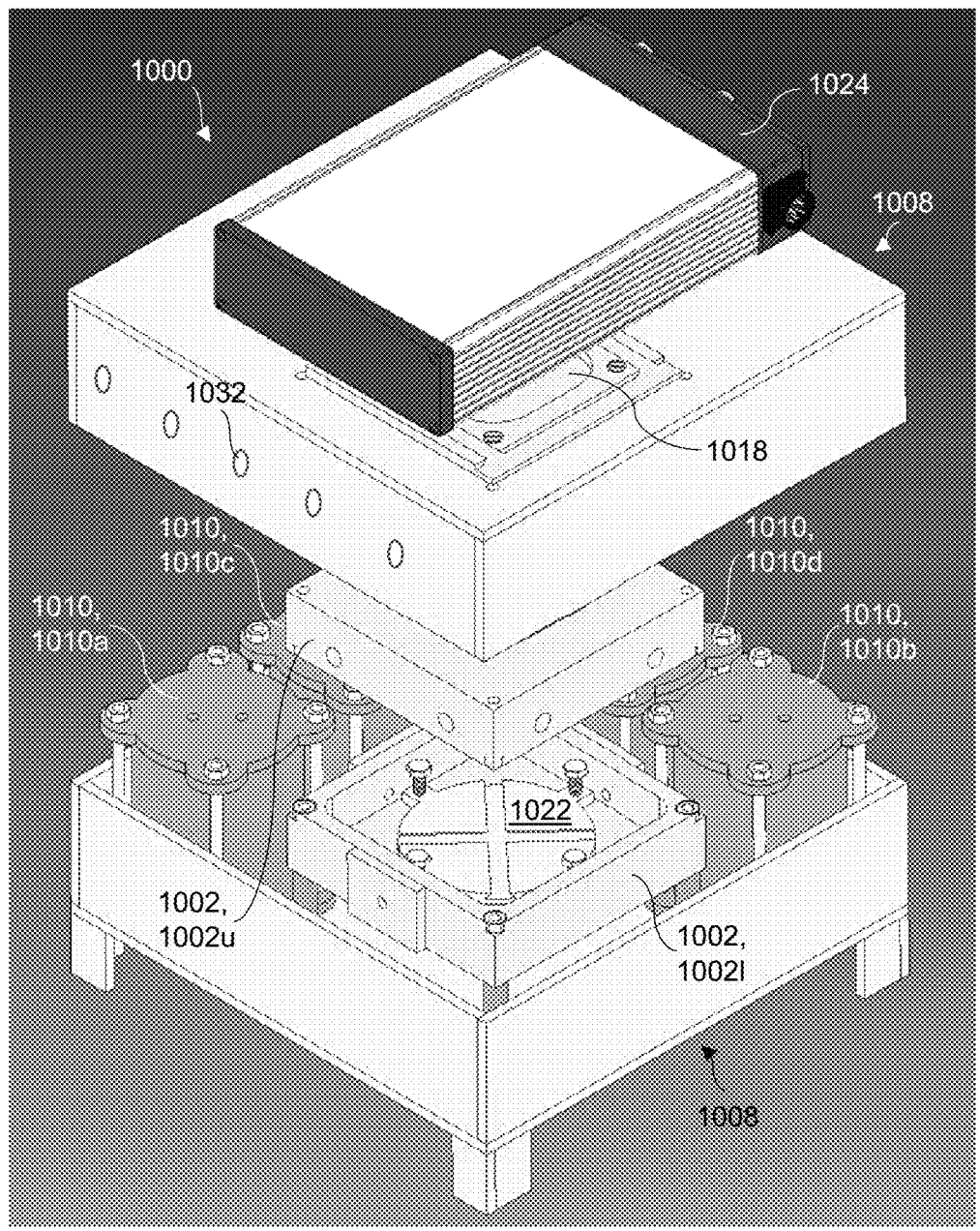
FIG. 10 is an exploded-view schematic of a modular apparatus for vapor-phase MacEtch, which includes inner and outer chambers.
Figure 11:
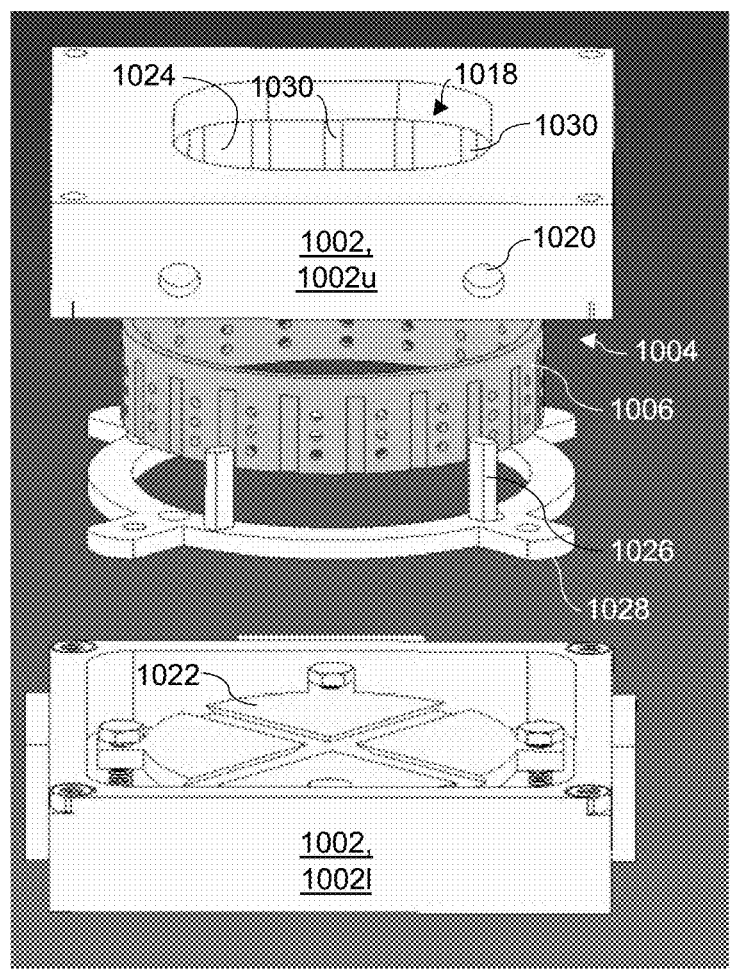
FIG. 11 is an exploded-view schematic of the inner chamber of the modular apparatus of FIG. 10.

Vapor-phase, catalyst-assisted chemical etching, with or without UV radiation, may be carried out in the modular apparatus 1000 shown in FIG. 10 (exploded view), which includes an inner chamber 1002 for containing a sample to be etched in a controlled environment, and an outer chamber 1008 for containing the reactants for the vapor-phase etching process. The outer chamber 1008 may enclose the inner chamber 1002, as shown. The inner chamber 1002 further includes a gas injection system 1004, as shown in FIG. 11 and described below, for injection of oxidant and acid vapors transported from the outer chamber 1008 to the sample. The inner chamber 1002 is designed to be completely modular to allow for arbitrary gas flow patterns. The outer chamber 1008 further includes a UV-transparent window 1018 positioned with line-of-sight access to the sample in the inner chamber 1002.

The outer chamber 1008 may be fabricated from a material resistant to harsh chemical or corrosive environments, such as a nickel-base superalloy (e.g., Inconel 625). As shown in FIG. 10, the outer chamber 1008 holds an oxidant bubbler 1010,1010a and an acid bubbler 1010,1010b, which are in fluid communication with the gas injection system 1004 in the inner chamber 1002 for vapor-phase etching. The oxidant bubbler 1010a serves as an oxidant source for containing an oxidant to be vaporized and delivered to the inner chamber 1002, and the acid bubbler 1010b functions as an acid source for containing an acid to be vaporized and delivered to the inner chamber 1002. Each bubbler 1010 is fabricated from a highly chemically-resistant material, such as polypropylene. Each of the oxidant and acid bubblers 1010a,1010b may include a heater and a closed-loop temperature control system that allows a constant oxidant vapor pressure to be maintained in the oxidant bubbler 1010a and a constant acid vapor pressure to be maintained in the acid bubbler 1010b.

Figure 12:
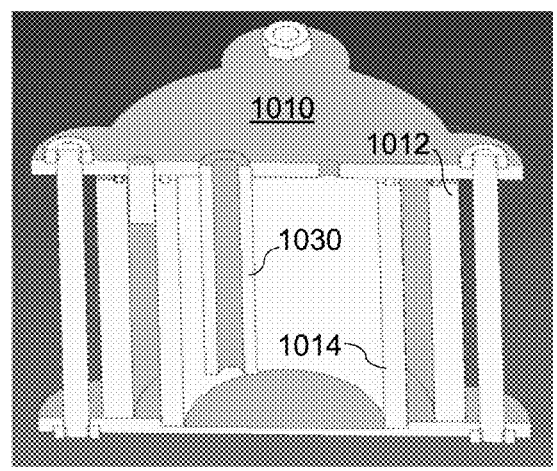
FIG. 12 is a sectional view of a bubbler from the modular apparatus of FIG. 10.

Referring now to FIG. 12, each bubbler 1010 may include an outer shell 1012, an inner shell 1014, a dip tube 1016, and a heater. The liquid in the bubbler (e.g, oxidant or acid) may be vaporized by flowing a carrier gas through the dip tube 1016, which dips underneath the liquid level. The resulting vapor (e.g., oxidant or acid vapor) may then be transported to the gas injection system 1004 in the inner chamber 1002 via a gas line connected to the bubbler 1010. The region between the inner and outer shells 1012,1014 of the bubbler 1010 may contain a hot liquid bath which may be maintained at a desired temperature by a heater, such as a small cartridge heater. The temperature may be measured and controlled via a closed-loop temperature control system, thereby keeping the bubbler 1010 at a constant temperature and vapor pressure, which allows precise dosing to be determined by mass flow controllers external to the enclosed chamber 1000. Since the oxidant and acid bubblers 1010a,1010b are heated independently, the oxidant can be heated to a temperature selected to produce a particular vapor pressure of the oxidant, while the acid may be heated to a temperature selected to produce a particular vapor pressure of the acid.

Returning to FIG. 10, additional vapor sources, such as a water bubbler 1010,1010c and/or an alcohol bubbler 1010, 1010d, configured as described above, may be positioned in the outer chamber 1008 in fluid communication with the gas injection system 1004 in the inner chamber 1002. These bubblers 1010 and any additional vapor sources may be independently heated to a suitable temperature to produce a desired vapor pressure of each species.

The outer chamber 1008 contains inlets 1032 for carrier gas lines originating from one or more external gas sources to be connected with the bubblers 1010. Also external to the outer chamber 1008 are mass flow controllers for controlling the flow rate of carrier gas into the inlets 1032. Each vapor may be transported from the vapor source to the inner chamber 1002 using the carrier gas. More specifically, a carrier gas may be flowed through the oxidant bubbler 1010a at a predetermined pressure or flow rate to transport the oxidant vapor to the gas injection system 1004 in the inner chamber 1002; the oxidant vapor becomes entrained in the carrier gas and is delivered from the oxidant bubbler 1010a to the inner chamber 1002. Similarly, a carrier gas is flowed through the acid bubbler 1010b at a predetermined pressure or flow rate, entraining the acid vapor and delivering it from the acid bubbler 1010b to the gas injection system 1004 in the inner chamber 1002. The carrier gas used to transport the oxidant vapor and the acid vapor may be an inert carrier gas such as nitrogen, argon or helium. Typically, the same carrier gas is used for transporting the oxidant, acid, and/or other vapors, although different carrier gases may be used if desired.

Referring to FIGS. 10 and 11, an upper portion 1002u of the inner chamber 1002 includes an opening 1018 sized to accommodate the UV-transparent window 1018 in the outer chamber 1008, such that light may be transmitted through the inner chamber 1002 and to the sample (e.g., from a UV lamp 1024). To maintain a controlled environment in the inner chamber 1002, the upper portion 1002u may be secured to the outer chamber 1008 around the UV-transparent window 1018.

The upper portion 1002u of the inner chamber 1002 is further configured to hold the gas injection system 1004, which may comprise a gas injection nozzle 1006. As can be seen in FIG. 11, the gas injection nozzle 1006 may be a showerhead nozzle having, in this example, a cylindrical shape. The gas injection nozzle 1006 is oriented within the inner chamber 1002 such that light from the UV-transparent window 1018 is not blocked from reaching the sample. The upper portion 1002u of the inner chamber 1002 also includes a plurality of flow channels 1020 for delivery of the oxidant and acid vapors from the oxidant and acid bubblers 1010a, 1010b into the gas injection system 1004.

Figure 13:
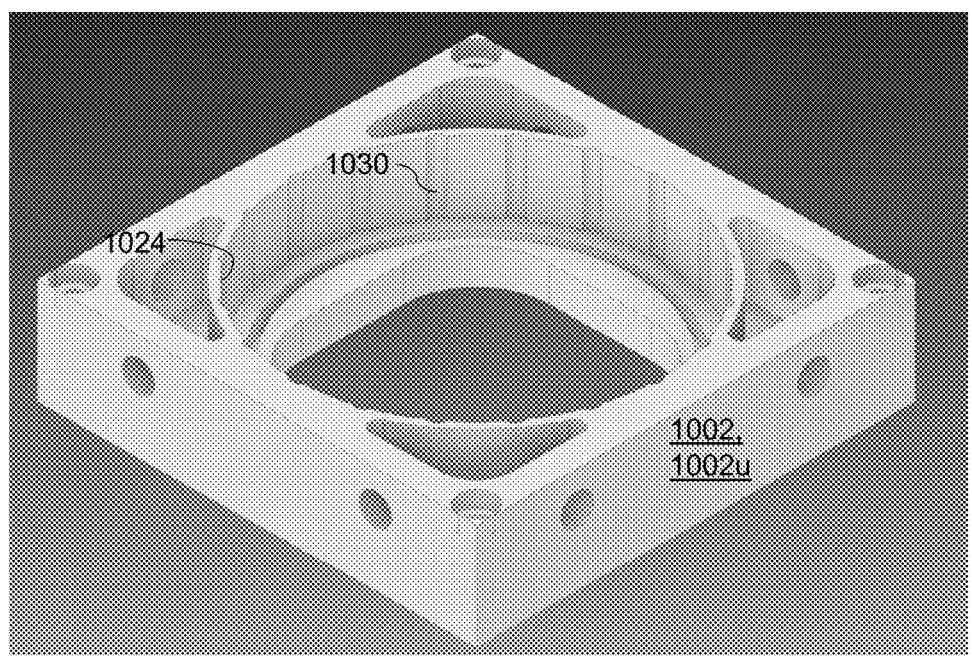
FIG. 13 is a perspective view of an upper portion of the inner chamber of the modular apparatus of FIG. 10, showing part of the gas injection system.

The gas injection system or compartment 1004 is modular. Referring to FIGS. 11 and 13, the gas injection system 1004 includes an outer ring 1024 for mounting the gas injection nozzle 1006. The outer ring 1024 includes a number of grooves (20 in this configuration) 1030, each of which may seat an indexing pin 1026, shown in FIG. 11, for partitioning the gas injection system 1004 as desired. The indexing pins 1026 may be held in place with a retaining brace 1028, which may also serve as a cap to the gas injection compartment 1004. This partitioning allows for controlled mixing of the oxidant and acid vapors as well as for volumetric ratios of the vapors. The oxidant and acid vapors are injected toward the sample to be etched through the multiple outlets in the gas injection nozzle 1006.

The sample to be etched may be located close to the delivery or injection point of the vapors, such that little to no mixing occurs prior to exposing the sample to the vapor-phase etchant. In the example of FIGS. 10 and 11, where the gas injection system 1004 comprises a gas injection nozzle 1006 having a cylindrical configuration, the sample may be positioned at one end of the cylinder, in line of sight of the UV-transparent window to allow for exposure to light (e.g., UV radiation) during etching. Another possible configuration is to have a planar gas injection nozzle disposed directly in opposition to the sample, with the planar gas injection nozzle and the sample oriented normal to the UV-transparent window such that light exposure may occur from the side. In this configuration, the gas injection system 1004 may be able to be placed very close to (e.g, within a few millimeters of) the sample to be etched.

The inner chamber 1002 comprises a lower portion 1002*l* including a sample support or chuck 1022 which is configured for controlled (e.g., resistive) heating of the sample to be etched. The sample support 1022 can be sized to hold samples of any desired size or shape and may be set to different angles or even be flipped upside down within the lower portion 1002*l*, as needed. One or more external pumps may be connected to the inner chamber 1002 to provide the desired controlled environment. The inner chamber 1002 may further include a pressure gauge and one or more exhaust ports, which may be held at atmospheric pressure or put under vacuum, as needed.

As indicated above, the new TiN catalyst may also be employed with liquid-phase MacEtch of silicon or other semiconductors. The method of liquid-phase TiN-assisted chemical etching may comprise providing an electrically-conductive patterned TiN layer on a semiconductor substrate, which may comprise any of the semiconductors set forth above. At least a portion of the semiconductor immediately below the patterned TiN layer may be selectively removed by immersing the patterned TiN layer and the semiconductor substrate into an etchant solution comprising an acid and an oxidizing agent, where the acid and the oxidizing agent are as described above. For example, a continuous or discontinuous patterned TiN layer formed on silicon may undergo liquid-phase MacEtch in a solution of hydrofluoric acid and hydrogen peroxide. Other details of liquid-phase MacEtch are provided in U.S. Pat. No. 8,951,430, U.S. Patent Application Publication No. 2017/0005207, and U.S. Patent Application Publication No. 2017/0243751, all of which are hereby incorporated by reference in their entirety.

The liquid-phase TiN-catalyzed chemical etching may occur at room temperature or at an elevated temperature (e.g., from about 30° C. to about 95° C., or from about 50° C. to about 95° C., where etching temperature may refer to the temperature of the etchant solution). Experiments reveal that forward MacEtch may be enhanced during vapor-phase and/or liquid-phase etching by increasing the mass transport by raising the etching temperature and/or by reducing the thickness of the TiN layer.

For example, liquid-phase TiN-assisted MacEtch of silicon may be aided by etching temperatures of about 50° C. or higher (e.g., up to about 95° C.), and enhanced forward etching may be obtained at reduced thicknesses. For example, silicon overlaid with a discontinuous patterned TiN layer of 10 nm or 30 nm in thickness has been shown to experience different amounts of forward and inverse etching. Under liquid-phase MacEtch at room temperature, the silicon underlying the 10 nm patterned TiN layer is partially forward etched, while the silicon underlying the 30 nm patterned TiN layer is inverse etched. This may be explained by the difference in stiffness of the TiN as function of the thickness, where thicker, and consequently stiffer, layers of TiN may be more easily detached at an edge from the silicon substrate during MacEtch. A poor interface between the patterned TiN layer and the semiconductor substrate can decrease the forward MacEtch rate, and unconsumed holes can be diffused on the uncovered regions of the substrate, which can accelerate inverse MacEtch.

Also, mass transport may be affected by dimensions of the patterned catalyst layer in both liquid-phase and vapor-phase MacEtch. For example, a smaller-diameter mesh pattern (e.g, a mesh-patterned TiN layer) may undergo increased inverse etching compared to a larger-diameter mesh pattern due to more limited mass transport resulting from a larger spacing between openings. As the diameter increases, forward MacEtch may start to dominate.

Mechanism

As described above, during MacEtch of silicon, electronic holes are produced underneath the catalyst by the reduction reaction of the oxidant (cathodic reaction) and injected in the valence band to produce oxidized silicon (anodic reaction), which is selectively dissolved by the acid. The process of hole generation, injection and diffusion in the semiconductor is defined as carrier generation (CG), and the transport of the etchant and byproducts is defined as mass transport (MT). In a CG dominant regime, MacEtch is governed by the number of holes injected in the semiconductor, and in a MT dominant regime, it is governed by the rate of oxidized Si removal. Inverse etching may result when mass transport is insufficient, and the injection and diffusion of holes occurs faster than the removal of oxidized silicon underneath the catalyst. Using the MacEtch techniques described herein, mass transport can be enhanced and the transition from inverse to forward MacEtch can be achieved.

Figure 5:
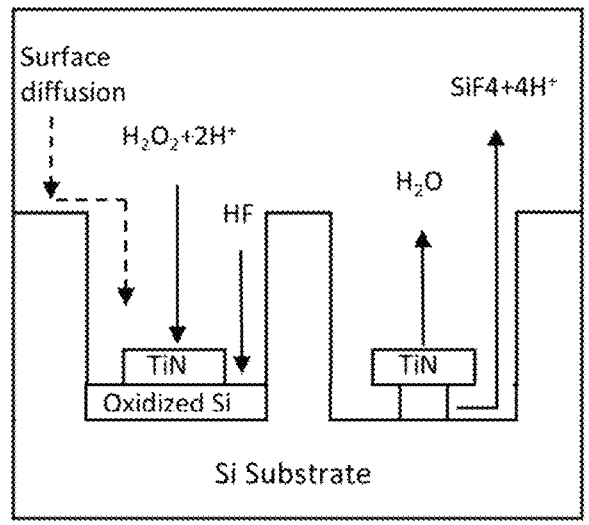
FIG. 5 illustrates a proposed mechanism of vapor-phase MacEtch when silicon is etched with a titanium nitride catalyst.

FIG. 5 shows a cross-sectional 2D schematic of the vapor-phase TiN-assisted chemical etching mechanism. The etching mechanism can be understood as having two components: (a) diffusion of the vapor-phase etchant (comprising the reactants, HF vapor and $H_2O_2$ vapor) and (b) vapor-phase diffusion of the byproducts ($H_2O$, $H_2SiF_6$, and $H_2$). When $H_2O_2$ and H+ vapor diffuse on the patterned TiN layer, holes are generated and injected in the valance band of the TiN-covered silicon region by reduction reaction to produce oxidized Si under the patterned TiN layer. When $H_2O_2$ and H+ vapor diffuse on uncovered silicon regions, the reduction reaction does not occur due to the absence of the catalyst; thus the uncovered silicon regions serve as a mask that allows the etchant species to be diffused in a lateral direction until they reach the nearest TiN catalyst. Vertical etching occurs when the HF vapor diffuses on the oxidized Si produced by hole injection. Since only the oxidized Si is chemically etched by HF, the effective amount of the HF vapor is again contributed by the vapor diffusing perpendicular to the oxidized Si and the vapor surface diffusing from Si or TiN to the oxidized Si. The byproduct of the reduction reaction ($H_2O$) is evaporated from the TiN interface to the surrounding atmosphere. The byproducts of $SiO_2$ etching ($H_2$, $SiF_4$ and $H_2SiF_6$) are diffused from under the TiN to the atmosphere. The liquid byproducts ($H_2O_2$ and $H_2SiF_6$) may need to be evaporated to be diffused to the surrounding atmosphere while the vapor byproducts ($H_2$, $SiF_6$) can be diffused as they are produced. If the evaporation rate of the liquid byproducts is slowed due to a low substrate temperature, the vapor byproducts can be trapped under the TiN catalyst, which can lead to the delamination or cracking of the catalyst.

Vertical etching is defined by the transport of the etchant and byproducts, similar to liquid-phase MacEtch. However, diffusion in the vapor phase is affected by temperature to the order of 3/2 according to Chapman-Enskog theory; in contrast, in the liquid phase, the diffusion coefficient of the solution is affected by the dynamic viscosity of the solution according to the Stokes-Einstein equation. Therefore, the MT can be significantly enhanced using vapor-phase MacEtch to overcome the limited MT resulting from a strong van der Waals force between the patterned TiN layer and the Si substrate.

FIGS. 9B and 9C illustrate the mechanism of UV photo-assisted vapor-phase MacEtch for a wide-bandgap semiconductor. In this example, the semiconductor substrate is assumed to comprise the wide-bandgap semiconductor gallium oxide (β-$Ga_2O_3$) with a platinum (Pt) metal catalyst. Referring to FIG. 9B, under above-gap UV illumination, electron (e−) and hole (h+) pairs are generated in areas that are not covered by the Pt catalyst pattern. It is believed that, when β-$Ga_2O_3$ is exposed to an HF—$K_2S_2O_8$ etchant (liquid-phase or vapor-phase), inverse MacEtch can take place through photo-enhanced chemical reactions, as shown in Eqs. (1)-(3) below. At the Pt catalyst surface (cathode), the oxidant ($K_2S_2O_8$) gets reduced (Eq. 1(a)), by consuming e− locally. Photo-pyrolysis of $S_2O_8^{2-}$ and subsequent reduction to $SO_4^{2-}$ could also take place as described by Eqs. 1(b1) and 1(b2). Because of the nature of the localized holes, no oxidation reaction of β-$Ga_2O_3$ takes place underneath Pt. Instead, the photo-generated e− diffuses towards Pt, which causes excess photo-generated holes on the surface of β-$Ga_2O_3$ with no Pt, as illustrated in FIG. 9B. The trapped holes induce oxidation reactions as described in Eq. 2(a), where $Ga_2O_3$ gets oxidized presumably to generate $O_2$ (bubbles can be observed). It is known that $GaF_3$ is insoluble in water, but it dissolves in HF (Eq. 2(b)), in which it forms an adduct with water ($GaF_3.H_2O$).

Cathode Reaction (At Metal)

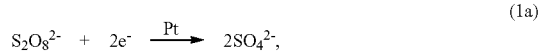

$$S_2O_8^{2-} + 2e^- \xrightarrow{Pt} 2SO_4^{2-}, \quad (1a)$$

$$S_2O_8^{2-} \xrightarrow{h\nu} 2SO_4^-, \quad (1b1)$$

$$SO_4^- + e^- \xrightarrow{Pt} SO_4^{2-}. \quad (1b2)$$

Anode Reaction

$$Ga_2O_3 + 6h^+ \rightarrow 2Ga^{3+} + 3/2 O_2, \quad (2a)$$

$$2Ga^{3+} + 6HF \rightarrow 2GaF_3 + 6H^+. \quad (2b)$$

Overall Reaction

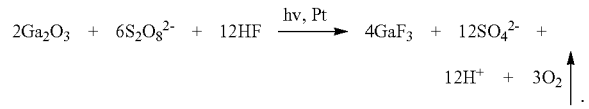

$$2Ga_2O_3 + 6S_2O_8^{2-} + 12HF \xrightarrow{h\nu, Pt} 4GaF_3 + 12SO_4^{2-} + 12H^+ + 3O_2\uparrow. \quad (3)$$

EXAMPLE 1

Samples comprising a patterned TiN layer (a TiN mesh pattern) of 30 nm in thickness on a silicon substrate are subjected to both liquid-phase and vapor-phase MacEtch.

Boron-doped p-type silicon substrates having a (100) orientation with a resistivity of 1-100 Ω-cm are used. The native oxide is etched in 1:100 HF:DI for 60 seconds. Then, a TiN layer of 5 nm, 10 nm, or 30 nm in thickness is deposited with plasma vapor deposition. A discontinuous patterned TiN layer can be fabricated by selective lift-off of the TiN layer on native oxide with BOE wet etching. To form a continuous patterned TiN layer (e.g., a mesh pattern), a 15 nm $SiO_2$ hard mask is deposited using plasma enhanced chemical vapor deposition (PECVD). Next, electron beam resist of 950 k PMMA in 2% anisole is spin-coated at 2000 rpm for 60 s (~80 nm thickness) and baked at 200° C. for 2 minutes. Patterns including hexagonal ordered dot arrays with diameters of 200 nm, 400 nm, and 800 nm at pitches of 400, 600, 800, and 1000 nm are exposed using electron beam lithography and developed in 1:3 MIBK:IPA for 2 minutes.

The patterns are transferred on the $SiO_2$ hard mask by etching in 1:10 buffered oxide etchant (BOE) for 15 s. The PMMA is removed in 5 min cycles in acetone, methanol, and IPA. Then, residual PMMA is etched by $O_2$ RIE at 200 mW for 2 min. The exposed TiN patterns are etched in 1:10 $NH_4OH:H_2O_2$ (~15 nm/min). The $SiO_2$ hard mask is etched in 1:10 BOE for 15 s.

Vapor-phase and liquid-phase MacEtch are carried out using the same etchant solution (49 wt. % HF, 30 wt. % $H_2O_2$ and IPA) on the patterned samples. To carry out vapor-phase MacEtch, a 3-inch Si substrate (or sample support) is placed on a hot plate. Then, the sample to be etched, which includes a patterned TiN layer on a silicon substrate, is placed at the center of the sample support. The surface temperature of the sample support and the sample to be etched are calibrated to match the etching temperature (50° C., 60° C., 70° C., 80° C., 90° C.). A MacEtch solution of 10 ml HF, 1 ml $H_2O_2$, and 10 ml IPA is mixed. A droplet comprising 10 μL of the MacEtch solution is deposited on the sample support adjacent to the sample using an HF-resistive micro-pipette. A total of 6-8 droplets are deposited on the sample support about 2 cm away from the sample. The solution is replenished soon after the droplets are completely evaporated. The resulting etched structures are inspected using a scanning electron microscope (SEM; Hitachi S-4800).

Figure 6A:
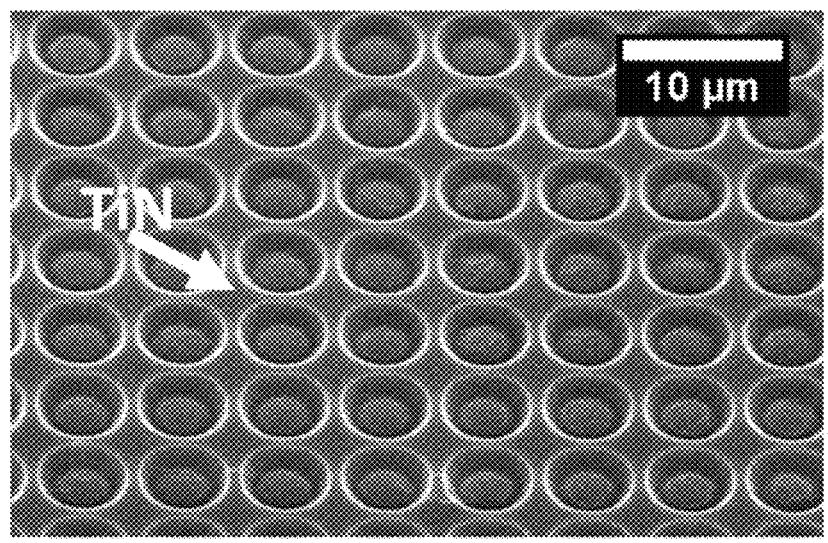
FIG. 6A shows a 45-degree tilted scanning electron microscope (SEM) image of a sample (mesh patterned TiN layer on a Si substrate) after liquid-phase MacEtch, showing evidence of inverse etching.

FIG. 6A shows a 45-degree tilted SEM image of the sample (TiN mesh pattern on Si substrate) after liquid-phase MacEtch. The sample underwent MacEtch in 0.28 M HF, 13 mM $H_2O_2$, 0.39 M IPA for 30 minutes at 70° C. and exhibits inverse etching; the uncovered silicon region is etched while the TiN-covered Si region remains intact, such that the etched silicon structure includes via-like etched features.

Figure 6B:
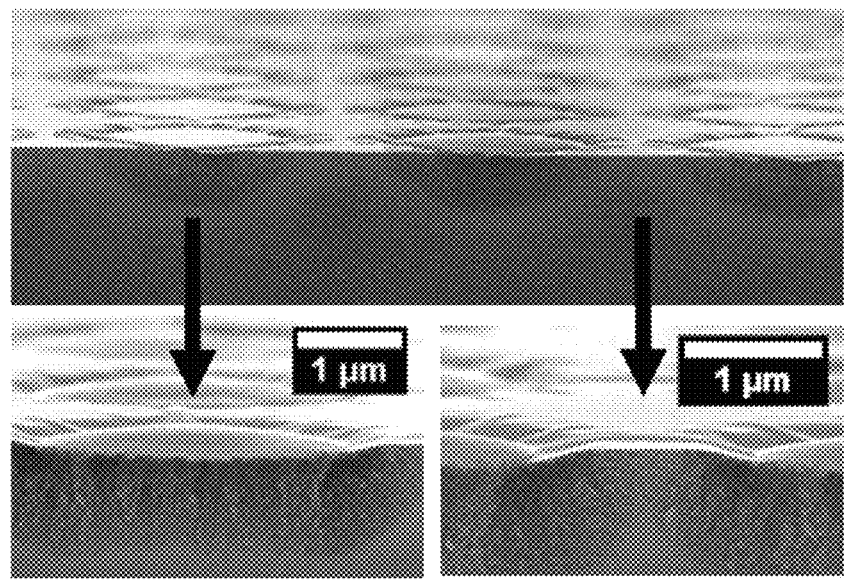
FIG. 6B shows a cross-sectional SEM image revealing the difference in porosity between TiN-covered regions and uncovered regions of the Si substrate.

FIG. 6B shows a cross-sectional SEM image of the sample (TiN mesh pattern on Si substrate) after liquid-phase MacEtch in the same solution for 5 minutes. The image shows the process of forming porous silicon in both uncovered regions (bottom left image) and TiN-covered regions (bottom right image). The silicon region underneath the TiN mesh is unevenly etched, resulting in deformation of the TiN. The porosity increases in silicon regions further from the TiN mesh, indicating that the formation and removal of $SiO_2$ is faster under in the uncovered silicon regions. These images suggest that inverse MacEtch results from limited mass transfer (MT) of the etchant under the TiN mesh; the injection and diffusion of holes occur faster than removal of the oxidized silicon formed under the TiN mesh, such that the unconsumed holes diffuse away from underneath the TiN mesh to uncovered silicon regions. This results in the formation and removal of oxidized silicon from the uncovered silicon regions.

Figure 7:
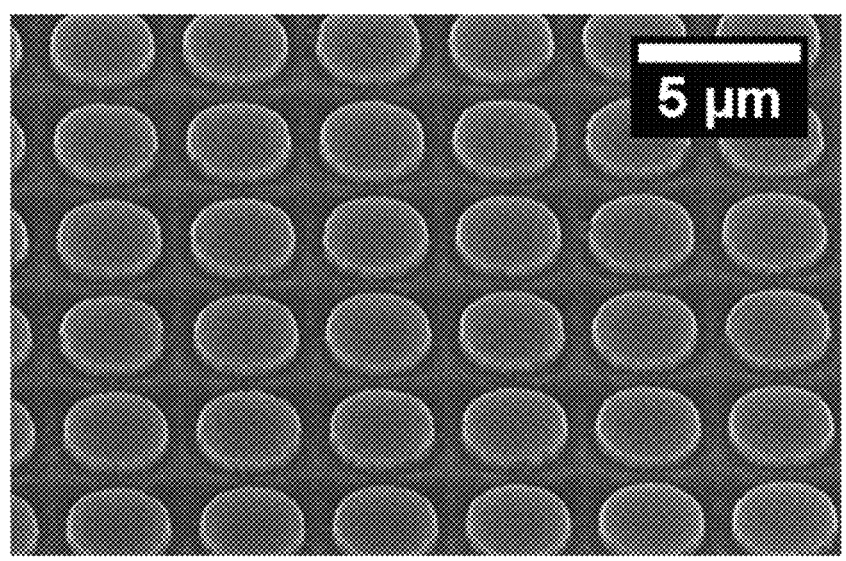
FIG. 7 shows a 45-degree tilted SEM image of a sample (mesh patterned TiN layer on a Si substrate) after vapor-phase MacEtch using the apparatus of FIG. 3, showing evidence of forward etching.

FIG. 3, which was discussed above, shows the set-up used for vapor-phase MacEtch of a sample that includes a TiN mesh pattern on a Si substrate. The sample is substantially identical to the sample that underwent liquid-phase MacEtch as described above. The sample is placed on a sample holder (in this example, a sacrificial 4-inch Si substrate) on a hot plate heated to 70° C. Droplets of 10 μL in volume comprising the same premixed MacEtch solution are dispersed on the sample holder about 1 cm away from the edge of the sample using a micropipette. MacEtch starts when the droplet comprising the MacEtch solution evaporates to form a vapor-phase etchant that diffuses on the TiN. The vapor-phase etchant is at the same or approximately the same temperature as the sample to be etched. The droplets on the sample holder are replenished soon after the droplets are completely evaporated. Etching is carried out for five minutes. FIG. 7 shows a 45-degree tilted SEM image of the vapor-phase MacEtched sample. The TiN-covered Si regions are uniformly etched by forward MacEtch; due to the quenching of inverse MacEtch achieved by the vapor-phase process, there is minimal or no tapering of the etched features.

Figure 8:
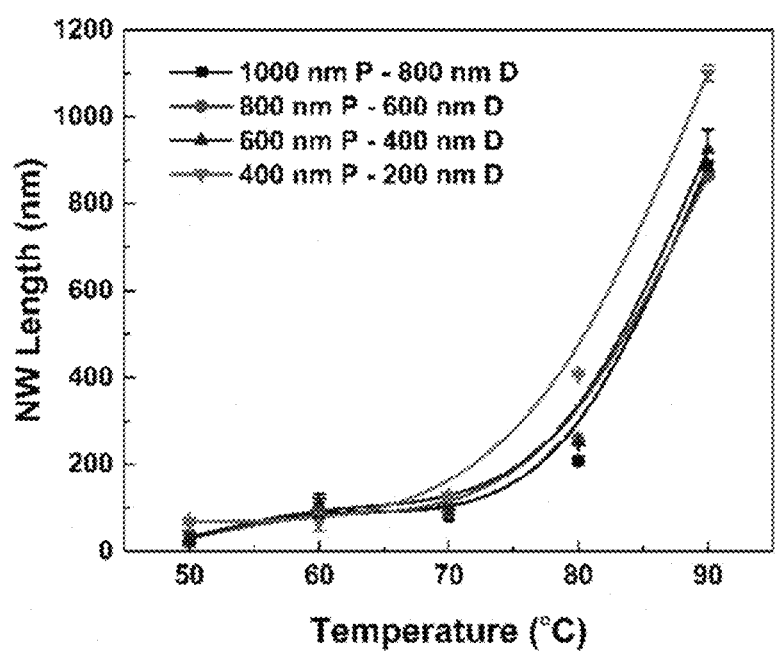
FIG. 8 shows silicon nanowire length as a function of etch temperature during vapor-phase MacEtch of a Si substrate using a mesh-patterned TiN catalyst layer.

FIG. 8 shows average length of Si nanowires formed during vapor-phase chemical etching with a mesh patterned TiN layer as set forth above (0.28 M HF, 13 mM $H_2O_2$, and 0.39 IPA) as a function of etching temperature from 50° C. to 90° C. The mesh patterned TiN layer has a fixed spacing of 100 nm and a pitch of 400 nm, 600 nm, 800 nm and 1000 nm. The data show that nanowire length, which is an indicator of forward etching, exponentially increases with increasing temperature, while the differences in the nanowire length for a fixed mesh spacing at different pitches are not significant.

EXAMPLE 2

In this example, a sample comprising a wide-bandgap semiconductor with a metal catalyst undergoes UV photo-assisted vapor-phase MacEtch in an experimental chamber to demonstrate the etching capabilities of this method. This same sample does not etch using conventional liquid-phase or vapor-phase MacEtch without UV light.

A sample of silicon carbide (SiC) is prepared with a standard degrease of acetone-isopropyl alcohol (IPA)-deionized water (DI water)-IPA, and then a platinum film is deposited on the SiC and patterned using photolithography to form of an array of platinum dots. The patterned sample is then placed on a silicon wafer in an experimental chamber configured for exposure to UV light. The chamber is purged with nitrogen gas constantly during etching, to protect the sample and the user, and an additional nitrogen purge surrounds an opening for a UV lamp. Next, six drops of a volumetric 2:13 49% HF: 30% $H_2O_2$ solution are placed on the wafer adjacent to the sample. A 254 nm UV lamp is then placed on top of the chamber and turned on, and the sample and the etching solution are then heated with approximately 50 and 75 watts respectively. The heating is continued until all of the etching solution has evaporated, forming a vapor-phase etchant that reacts with the sample. The chamber is left to purge for an additional 30 seconds with the UV lamp on. The sample is then washed with DI water. This experiment demonstrates that silicon carbide can be successfully etched at an etch rate of about 0.1-1 µm/min using photo-assisted vapor-phase MacEtch with a UV wavelength of 254 nm. The etch rate is expected to increase at shorter UV wavelengths due to increased charge carrier generation.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of catalyst-assisted chemical etching with a vapor-phase etchant, the method comprising:
   heating a sample to be etched in a vacuum chamber comprising an inert gas atmosphere or vacuum, the sample comprising a semiconductor substrate with a patterned catalyst layer thereon;
   heating an oxidant source containing an oxidant to form an oxidant vapor, the oxidant source being in fluid communication with the enclosed chamber;
   separately heating an acid source containing an acid to form an acid vapor, the acid source being in fluid communication with the enclosed chamber; and
   during the heating of the sample, exposing the sample to a vapor-phase etchant comprising the oxidant vapor and the acid vapor,
   wherein the vapor-phase etchant diffuses through the patterned catalyst layer and etches catalyst-covered regions of the semiconductor substrate, thereby forming an etched semiconductor structure.

2. The method of claim 1, wherein the oxidant source is connected to the vacuum chamber by a first flow channel, and
   wherein the acid source is connected to the vacuum chamber by a second flow channel, and
   wherein exposing the sample to the vapor-phase etchant comprises transporting the oxidant vapor and the acid vapor through the first and second flow channels to the vacuum chamber.

3. The method of claim 2, wherein transporting the oxidant vapor through the first and second flow channels to the vacuum chamber comprises flowing a first carrier gas through the oxidant source and entraining the oxidant vapor in the first carrier gas, and
   wherein transporting the acid vapor to the vacuum chamber comprises flowing a second carrier gas through the acid source and entraining the acid vapor in the second carrier gas.

4. The method of claim 3, wherein each of the first and second carrier gases comprises an inert gas selected from the group consisting of nitrogen, helium and argon, and
   wherein a mass flow controller controls the flow of each of the first and second carrier gases.

5. The method of claim 1, wherein the semiconductor substrate comprises a semiconductor selected from the group consisting of: silicon, germanium, and a III-V semiconductor,
   wherein the oxidant is selected from the group consisting of: $H_2O_2$, $KMnO_4$, $Na_2S_2O_8$, and $K_2S_2O_8$,
   wherein the acid is selected from the group consisting of: HF and $H_2SO_4$, and
   wherein the patterned catalyst layer comprises a catalyst selected from the group consisting of: TiN, Ag, Au, Cu, Pd and Pt.

6. The method of claim 1, wherein the oxidant and acid sources are positioned remote from the sample to be etched.

7. The method of claim 1, wherein the oxidant source is heated to a temperature selected to produce a particular vapor pressure of the oxidant, and
   wherein the acid source is separately heated to a temperature selected to produce a particular vapor pressure of the acid.

8. A method of catalyst-assisted chemical etching with a vapor-phase etchant, the method comprising:

providing a sample to be etched in a vacuum chamber comprising an inert gas atmosphere or vacuum, the sample comprising a semiconductor substrate with a patterned catalyst layer thereon, the semiconductor substrate comprising a wide-bandgap semiconductor;

exposing the sample to a vapor-phase etchant comprising an oxidant vapor and an acid vapor, and exposing the sample to above-gap ultraviolet (UV) radiation, whereby photo-enhanced, catalyst-assisted chemical reactions occur at a surface of the semiconductor substrate, and surface regions of the semiconductor substrate undergo etching, thereby forming an etched semiconductor structure comprising the wide-bandgap semiconductor.

9. The method of claim 8, wherein exposing the sample to the vapor-phase etchant comprises:

heating an oxidant source containing an oxidant to form an oxidant vapor, the oxidant source being external to the vacuum chamber, and transporting the oxidant vapor to the enclosed chamber;

separately heating an acid source containing an acid to form an acid vapor, the acid source being external to the vacuum chamber, and transporting the acid vapor to the enclosed chamber.

10. The method of claim 8, wherein the surface regions that undergo etching are catalyst-covered surface regions, the etching being forward etching.

11. The method of claim 8, wherein the surface regions that undergo etching are uncovered surface regions, the etching being inverse etching.

12. The method of claim 8, wherein the wide-band gap semiconductor is selected from the group consisting of GaN, SiC, $Ga_2O_3$, ZnO, ZnSe, $LiNO_4$, and diamond.

13. The method of claim 8, wherein the oxidant and oxidant vapor are selected from the group consisting of hydrogen peroxide ($H_2O_2$), $KMnO_4$, $K_2S_2O_8$, and $Na_2S_2O_8$, and the acid and acid vapor are selected from the group consisting of hydrofluoric acid (HF), nitric acid ($HNO_3$), and $NH_4F$.

14. The method of claim 8, wherein the above-gap UV radiation has a wavelength in a range from about 100 nm to about 300 nm.

15. The method of claim 14, wherein the wavelength is in the range from about 10 nm to about 180 nm, the above-gap UV radiation being vacuum UV radiation.

16. The method of claim 8, wherein the sample is exposed to the above-gap UV radiation from a UV source external to the vacuum chamber, the above-gap UV radiation passing through a UV-transparent window in the vacuum chamber.

17. The method of claim 8, wherein exposing the sample to the vapor-phase etchant comprises:

vaporizing an oxidant contained in an oxidant source and delivering oxidant vapor to the vacuum chamber, the oxidant source being external to the vacuum chamber, and vaporizing an acid contained in an acid source and delivering acid vapor to the vacuum chamber, the acid source being external to the vacuum chamber, wherein the oxidant and acid sources are separate from each other and remote from the sample to be etched.

18. The method of claim 17, wherein vaporizing the oxidant comprises heating the oxidant source to a temperature selected to produce a particular vapor pressure of the oxidant, and wherein vaporizing the acid comprises separately heating the acid source to a temperature selected to produce a particular vapor pressure of the acid.

19. The method of claim 8, wherein the vacuum chamber is an inner chamber of a modular apparatus comprising:

an outer chamber containing an acid source and an oxidant source;

the inner chamber comprising the inert gas atmosphere or vacuum and containing the sample to be etched, and further comprising a gas injection system containing a gas injection nozzle, wherein exposing the sample to the vapor-phase etchant comprises injecting oxidant and acid vapors transported from the outer chamber through multiple outlets in the gas injection nozzle and toward the sample to be etched.

20. The method of claim 19, wherein an inert carrier gas comprising nitrogen, argon or helium is used to transport each of the oxidant and acid vapors from the outer chamber to the gas injection system at a predetermined pressure or flow rate.

21. The method of claim 19, wherein the acid source and the oxidant source are independently heated.

* * * * *